(12) United States Patent
Ryu et al.

(10) Patent No.: US 12,075,688 B2
(45) Date of Patent: Aug. 27, 2024

(54) DISPLAY DEVICE INCLUDING SUPPORT PLATE WITH OPENING

(71) Applicant: Samsung Display Co., Ltd., Yongin-Si (KR)

(72) Inventors: Suchang Ryu, Yongin-si (KR); Sunjoong Gwak, Cheonan-si (KR); Yong-Kwan Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 422 days.

(21) Appl. No.: 17/470,372

(22) Filed: Sep. 9, 2021

(65) Prior Publication Data

US 2022/0231239 A1   Jul. 21, 2022

(30) Foreign Application Priority Data

Jan. 20, 2021   (KR) .................... 10-2021-0007786

(51) Int. Cl.
*H10K 77/10* (2023.01)
*B32B 3/04* (2006.01)
*B32B 27/20* (2006.01)
*H05K 5/00* (2006.01)
*H10K 102/00* (2023.01)

(52) U.S. Cl.
CPC .............. *H10K 77/111* (2023.02); *B32B 3/04* (2013.01); *B32B 27/20* (2013.01); *H05K 5/0017* (2013.01); *B32B 2262/106* (2013.01); *B32B 2457/206* (2013.01); *H10K 2102/311* (2023.02)

(58) Field of Classification Search
CPC ............ H10K 77/111; H10K 2102/311; B32B 2457/206; B32B 3/04; B32B 2262/106
See application file for complete search history.

(56) References Cited

U.S. PATENT DOCUMENTS

| | | | |
|---|---|---|---|
| 9,012,785 B2 | 4/2015 | Otsubo | |
| 10,074,824 B2 | 9/2018 | Han et al. | |
| 2015/0017417 A1* | 1/2015 | Min | ........................ B32B 27/12 428/300.7 |
| 2016/0239133 A1* | 8/2016 | Ko | ........................ G06F 1/1643 |
| 2020/0051881 A1* | 2/2020 | Park | ........................ B32B 3/04 |
| 2020/0075873 A1* | 3/2020 | Jing | ........................ H05K 1/038 |
| 2021/0233447 A1 | 7/2021 | Park | |
| 2023/0278167 A1* | 9/2023 | Cho | ........................ B24C 1/04 |

FOREIGN PATENT DOCUMENTS

| | | |
|---|---|---|
| KR | 1020160144912 A | 12/2016 |
| KR | 1020180036904 A | 4/2018 |
| KR | 1020210096725 A | 8/2021 |

\* cited by examiner

*Primary Examiner* — Nduka E Ojeh
(74) *Attorney, Agent, or Firm* — CANTOR COLBURN LLP

(57) ABSTRACT

A display device includes a display module and a support plate disposed on the display module and including a plurality of first fibers and a plurality of second fibers disposed on the first fibers and extending to cross the first fibers in a plan view. An opening is defined in the support plate and includes first sides parallel to an extension direction of the first fibers and facing each other and second sides parallel to an extension direction of the second fibers and facing each other.

20 Claims, 16 Drawing Sheets

DISPLAY DEVICE INCLUDING SUPPORT PLATE WITH OPENING

This application claims priority to Korean Patent Application No. 10-2021-0007786, filed on Jan. 20, 2021, and all the benefits accruing therefrom under 35 U.S.C. § 119, the content of which in its entirety is herein incorporated by reference.

BACKGROUND

1. Field

Embodiments of the invention herein relate to a display device.

2. Description of the Related Art

Electronic devices, such as a smart phone, a digital camera, a notebook computer, a navigation system, and a smart television, which provide images to users, include a display device for displaying images. The display device generates images and provides the images to users through a display screen.

With a recent technological development of display devices, various types of display devices are being developed. Various flexible display devices, which may be transformed into a curved, folded or rolled shape, for example, are being developed. The flexible display devices, which may be transformed into various shapes, are easy to carry and improve the convenience of users.

Among the flexible display devices, a foldable display device includes a display module that is folded along a folding axis extending in one direction. The display module is folded or unfolded around the folding axis. The display module includes a folding region that is bent during folding. A technology that enables the folding region to be more easily folded may be desired.

SUMMARY

Embodiments of the invention provide a display device having a folding region which may be more easily folded.

An embodiment of the invention provides a display device including a display module and a support plate disposed on the display module and including a plurality of first fibers and a plurality of second fibers disposed on the plurality of first fibers and crossing the plurality of first fibers in a plan view. An opening is defined in the support plate and includes first sides parallel to the plurality of first fibers and facing each other, and second sides parallel to the plurality of second fibers and facing each other.

In an embodiment of the invention, a display device may include a display module including a first non-folding region, a second non-folding region, and a folding region disposed between the first and second non-folding regions, and a support plate disposed on the display module and includes a plurality of first fibers extending in a first diagonal direction and arranged in a second diagonal direction crossing the first diagonal direction, and a plurality of second fibers disposed at a location different from a location of the plurality of first fibers in a thickness direction, extending in the second diagonal direction, and arranged in the first diagonal direction. An opening overlapping the folding region is defined in the support plate and includes first sides extending in the first diagonal direction and facing each other in the second diagonal direction and second sides extending in the second diagonal direction and facing each other in the first diagonal direction.

In an embodiment of the invention, a display device may include a display module extending in a first direction and foldable around a folding axis parallel to a second direction crossing the first direction, and a support plate disposed on the display module and includes a plurality of first fibers extending in a first diagonal direction crossing the first and second directions and a plurality of second fibers disposed at a location different from a location of the plurality of first fibers in a thickness direction, and extending in a second diagonal direction crossing the first diagonal direction. Openings overlapping the folding region are defined in the support plate and arranged in the first diagonal direction and the second diagonal direction.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
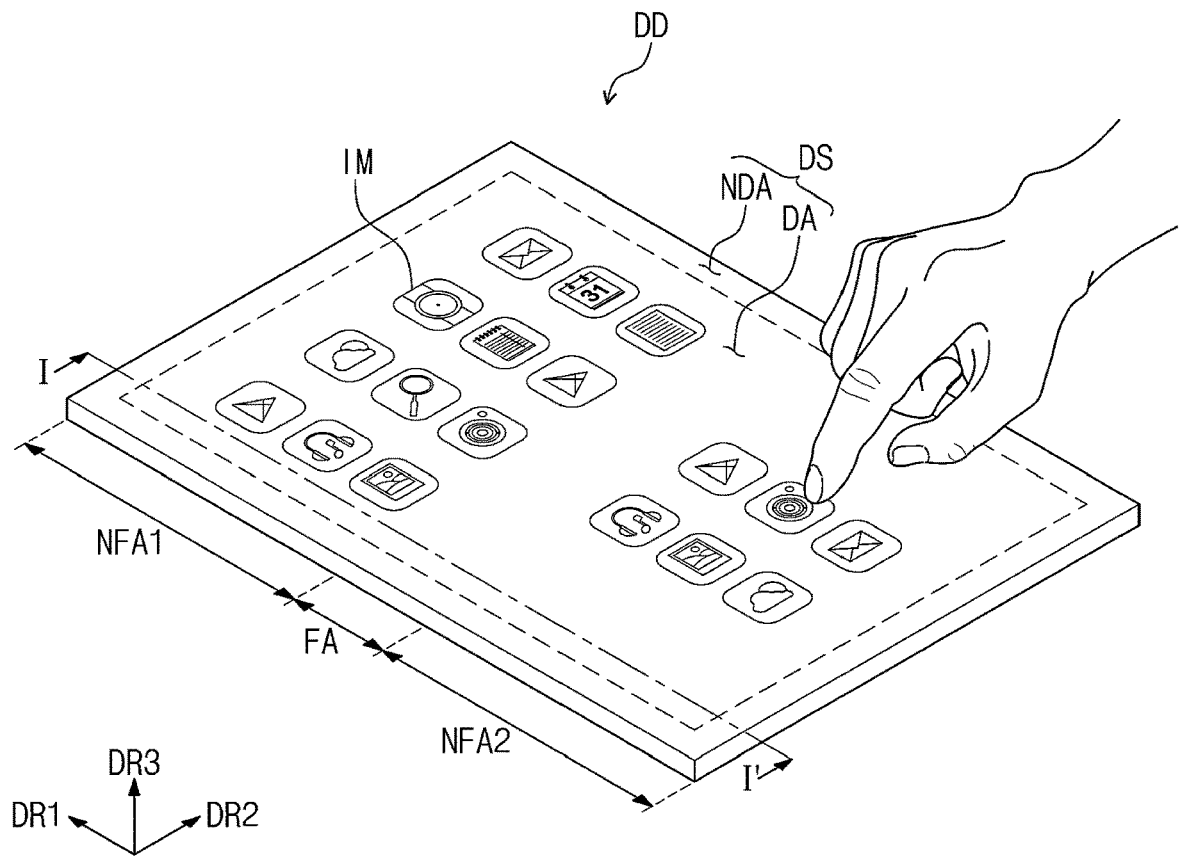
FIG. 1 is a perspective view of an embodiment of a display device according to the invention.

In this specification, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like reference numerals refer to like elements throughout. In addition, in the drawings, the thicknesses, ratios, and dimensions of elements are exaggerated for effective description of the technical contents. As used herein, the term "and/or" includes any and all combinations that the associated configurations can define.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that the terms "include", "including", and/or "have", when used in this specification, specify the presence of stated features, integers, steps, operations, elements, components and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

Figure 2:
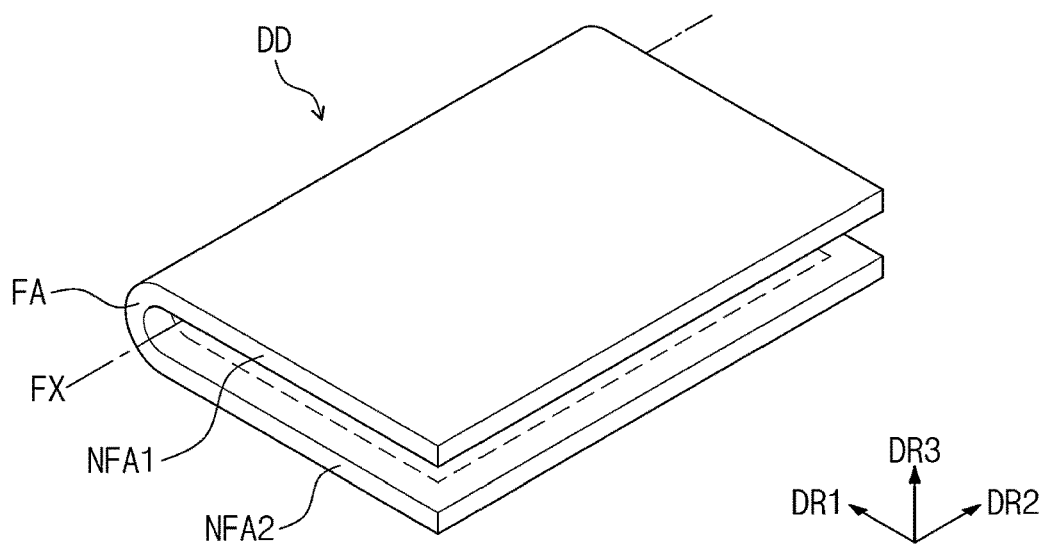
FIG. 2 illustrates a folded state of the display device illustrated in FIG. 1.

FIG. 1 is a perspective view of an embodiment of a display device according to the invention. FIG. 2 illustrates a folded state of the display device illustrated in FIG. 1.

Referring to FIG. 1, the display device DD in an embodiment of the invention may have a quadrangular (e.g., rectangular) shape having long sides extending in a first direction DR1 and short sides extending in a second direction DR2 crossing the first direction DR1. However, without being limited thereto, the display device DD may have various shapes such as a circle and a polygon. The display device DD may be a flexible display device.

Hereinafter, a direction substantially perpendicular to a plane defined by the first direction DR1 and the second direction DR2 is defined as a third direction DR3. In addition, in this specification, the expression "in a plan view" may be defined as a state of being viewed in the third direction DR3.

The display device DD may include a folding region FA and a plurality of non-folding regions NFA1 and NFA2. The non-folding regions NFA1 and NFA2 may include a first non-folding region NFA1 and a second non-folding region NFA2. The folding region FA may be disposed between the first non-folding region NFA1 and the second non-folding region NFA2. The first non-folding region NFA1, the folding region FA, and the second non-folding region NFA2 may be arranged in the first direction DR1.

Although one folding region FA and two non-folding regions NFA1 and NFA2 are illustrated, the number of the folding region FA and the non-folding regions NFA1 and NFA2 is not limited thereto. In an embodiment, the display device DD may include more than two non-folding regions and a plurality of folding regions disposed between the non-folding regions, for example.

The upper surface of the display device DD may be defined as a display surface DS and have a plane defined by the first direction DR1 and the second direction DR2. Images IM generated in the display device DD may be provided to users through the display surface DS.

The display surface DS may include a display region DA and a non-display region NDA around the display region DA. The display region DA may display images, and the non-display region NDA may not display images. The non-display region NDA may surround the display region DA and define a border of the display device DD printed in a predetermined color.

Referring to FIG. 2, the display device DD may be a foldable display device DD that is folded or unfolded. In an embodiment, the folding region FA may be bent along a folding axis FX parallel to the second direction DR2 so that the display device DD is folded, for example. The folding axis FX may be defined as a short axis parallel to a short side of the display device DD.

When the display device DD is folded, the first non-folding region NFA1 and the second non-folding region NFA2 may face each other, and the display device DD may be in-folded so that the display surface DS is not exposed to the outside.

Figure 3:
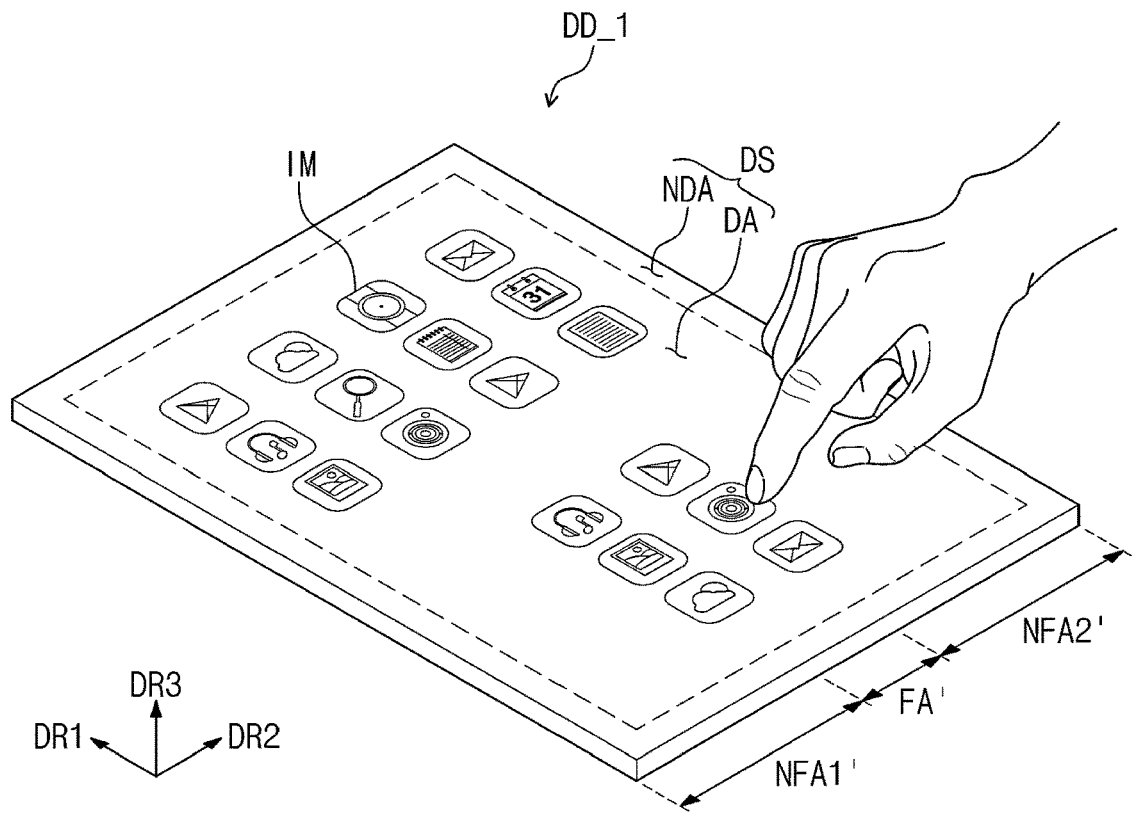
FIG. 3 is a perspective view of an embodiment of a display device according to the invention.
Figure 4:
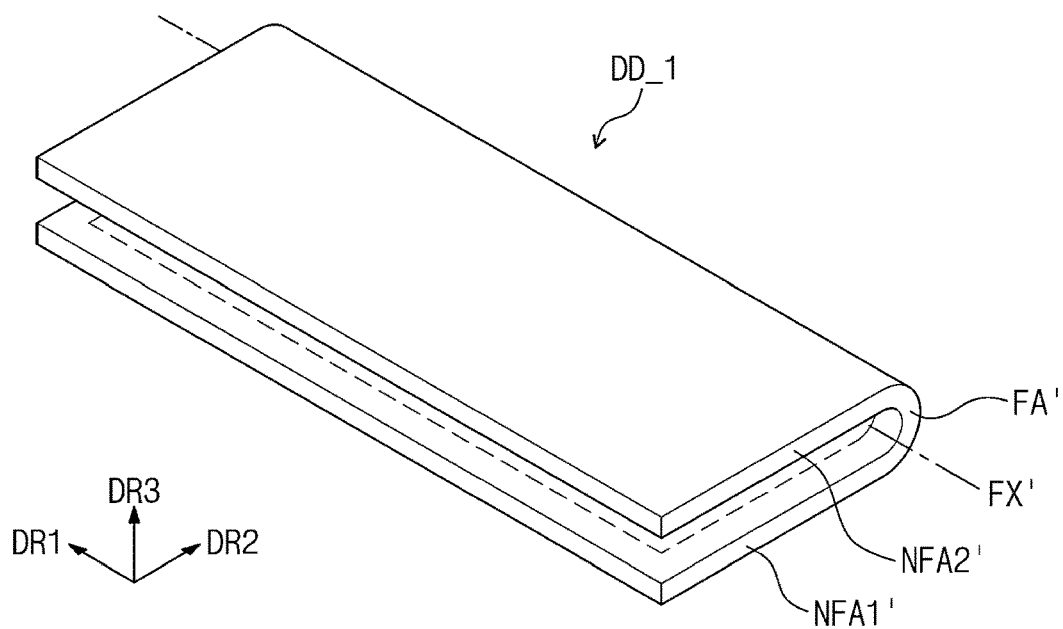
FIG. 4 illustrates a folded state of the display device illustrated in FIG. 3.

FIG. 3 is a perspective view of an embodiment of a display device according to the invention. FIG. 4 illustrates a folded state of the display device illustrated in FIG. 3.

Except for folding operation, the display device DD_1 illustrated in FIG. 3 may have substantially the same configuration as the display device DD illustrated in FIG. 1. Accordingly, hereinafter, mostly, the folding operation of the display device DD_1 will be described.

Referring to FIGS. 3 and 4, the display device DD_1 may include a folding region FA' and a plurality of non-folding regions NFA1' and NFA2'. The non-folding regions NFA1' and NFA2' may include a first non-folding region NFA1' and a second non-folding region NFA2'. The folding region FA' nay be disposed between the first non-folding region NFA1' and the second non-folding region NFA2'. The first non-folding region NFA1', the folding region FA1, and the second non-folding region NFA2' may be arranged in the second direction DR2.

The folding region FA' may be bent along a folding axis FX' parallel to the first direction DR1 so that the display device DD_1 is folded. The folding axis FX' may be defined as a long axis parallel to a long side of the display device DD_1. The display device DD illustrated in FIG. 1 may be folded along the short axis, whereas the display device DD_1 illustrated in FIG. 3 may be folded along the long axis. The display device DD_1 may be in-folded so that the display surface DS is not exposed to the outside.

Although the display devices that are in-folded are illustrated, the invention are not limited thereto. In an embodiment, the display devices DD and DD_1 may be out-folded respectively along the folding axes FX and FX' so that the display surfaces DS are exposed to the outside.

Hereinafter, as an example, the display device DD that is in-folded along the folding axis FX parallel to a short axis will be described.

Figure 5:
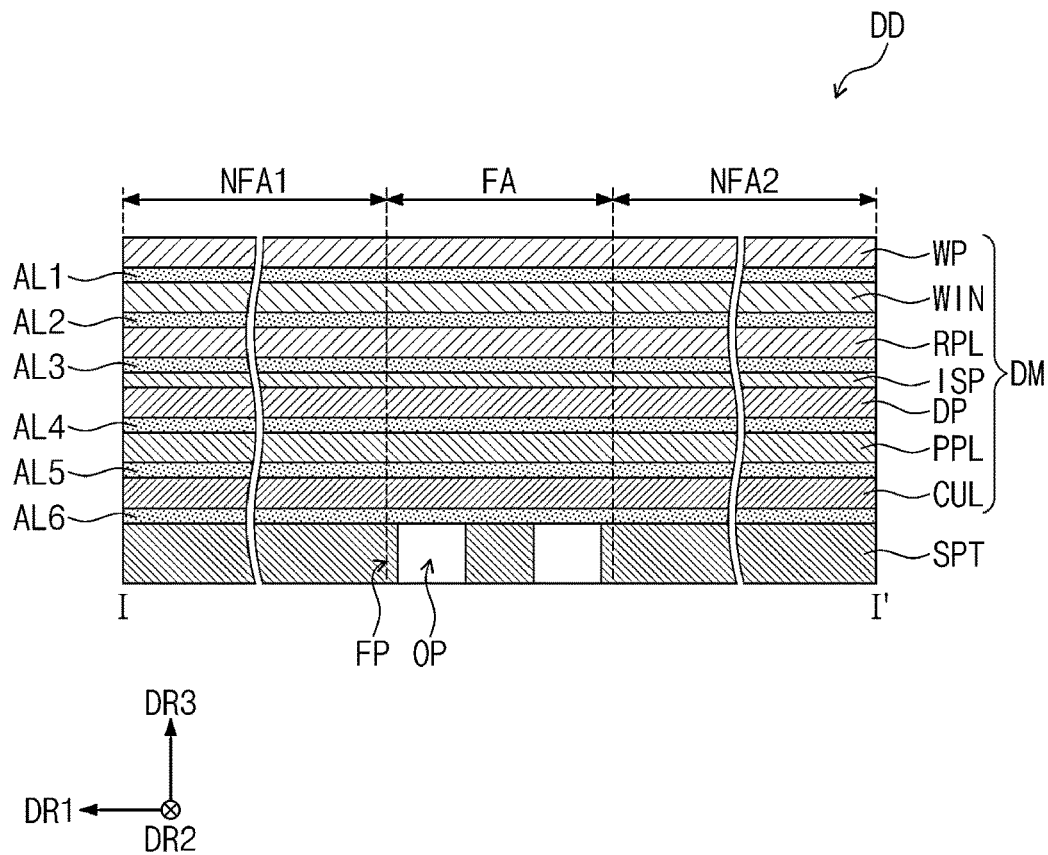
FIG. 5 is a cross-sectional view taken along line illustrated in FIG. 1.

FIG. 5 is a cross-sectional view taken along line illustrated in FIG. 1.

Referring to FIG. 5, the display device DD may include a display module DM and a support plate SPT disposed below the display module DM. The display module DM may include a first on-folding region NFA1, a second non-folding region NFA2, and a folding region FA disposed between the first and second non-folding regions NFA1 and NFA2. The folding region FA may be folded around the folding axis FX described above.

The support plate SPT may support the display module DM below the display module DM. In a plan view, a plurality of openings OP may be defined in the support plate SPT and overlap the folding region FA of the display module DM. A portion of the support plate SPT overlapping the folding region FA may be defined as a folding portion FP. The openings OP may be defined in the folding portion FP.

The support plate SPT may include carbon fiber reinforced plastic ("CFRP"). In an embodiment, the support plate SPT may include plastic and a plurality of carbon fibers disposed inside the plastic. The CFRP may be lighter than metal. Since the support plate SPT including the CFRP is used to support the display module DM, the display device DD may be lightened.

The display module DM may include a display panel DP, an input sensing unit ISP, a reflection prevention layer RPL, a window WIN, a window protection layer WP, a panel protection layer PPL, a cushion layer CUL, and first to sixth adhesive layers AL1 to AL6.

The display panel DP in an embodiment of the invention may be a light-emitting display panel. In an embodiment, the display panel DP may be an organic light-emitting display panel or a quantum dot light-emitting display panel, for example. A light-emitting layer of the organic light-emitting display panel may include an organic light-emitting material. A light-emitting layer of the quantum dot light-emitting display panel may include quantum dots, quantum rods, or the like. Hereinafter, the display panel DP is described as an organic light-emitting display panel.

The display panel DP may be a flexible display panel. Like the display module DM, the display panel DP may include a first non-folding region NFA1, a folding region FA, and a second non-folding region NFA2. The display panel DP may include a plurality of pixels for displaying images. The pixels may include organic light-emitting elements.

The input sensing unit ISP may be disposed on the display panel DP. The input sensing unit ISP may include a plurality of sensors (not illustrated) for sensing an external input. The sensors may sense external inputs in a capacitive method. When the display device DD is manufactured, the input sensing unit ISP may be manufactured directly on the display panel DP. However, without being limited thereto, the input sensing unit ISP may be manufactured as a panel independent of the display panel DP and then attached to the display panel DP by an adhesive layer.

The reflection prevention layer RPL may be disposed on the display panel DP. The reflection prevention layer RPL may be defined as an external light reflection prevention film. The reflection prevention layer RPL may reduce the reflectance of external light incident from above the display device DD toward the display panel DP.

When external light traveling toward the display panel DP is reflected like a mirror from the display panel DP and provided again to an external user, the user may visually recognize external light. In order to prevent such a phenomenon, as an example, the reflection prevention layer RPL may include a plurality of color filters that display the same colors as those of the pixels.

The color filters may filter external light so as to display the same colors as those of the pixels. In this case, external light may not be visible to a user. However, without being limited thereto, the reflection prevention layer RPL may include a retarder and/or a polarizer for reducing the reflectance of external light.

The window WIN may be disposed on the reflection prevention layer RPL. The window WIN may protect the display panel DP, the input sensing unit ISP, and the reflection prevention layer RPL from external scratch. The window WIN may have optically transparent properties. In an embodiment, the window WIN may include glass. The window WIN may be defined as ultra-thin glass ("UTG"). However, without being limited thereto, the window WIN may include a synthetic resin film.

The window protection layer WP may be disposed on the window WIN. The window protection layer WP may protect the window WIN. In an embodiment, the window protection layer WP may include a flexible plastic material such as polyimide ("PI") or polyethylene terephthalate ("PET"). Although not illustrated, a hard coating layer may be further disposed on the window protection layer WP. In addition, an anti-fingerprint layer or an anti-scattering layer defined as a functional layer may be further disposed on the window protection layer WP.

The panel protection layer PPL may be disposed below the display panel DP. The panel protection layer PPL may protect the lower portion of the display panel DP from external scratch. The panel protection layer PPL may include a flexible plastic material. In an embodiment, the panel protection layer PPL may include polyethylene terephthalate, for example.

The cushion layer CUL may be disposed below the panel protection layer PPL. The cushion layer CUL may protect the display module DM by absorbing an external shock applied to the lower portion of the display module DM. The cushion layer CUL may include a foam sheet having a predetermined elasticity. The cushion layer CUL may include foam, sponge, polyurethane, or thermoplastic polyurethane.

The first adhesive layer AL1 may be disposed between the window protection layer WP and the window WIN. The window protection layer WP and the window WIN may be bonded to each other by the first adhesive layer AL1.

The second adhesive layer AL2 may be disposed between the window WIN and the reflection prevention layer RPL. The window WIN and the reflection prevention layer RPL may be bonded to each other by the second adhesive layer AL2.

The third adhesive layer AL3 may be disposed between the reflection prevention layer RPL and the input sensing unit ISP. The reflection prevention layer RPL and the input sensing unit ISP may be bonded to each other by the third adhesive layer AL3.

The fourth adhesive layer AL4 may be disposed between the display panel DP and the panel protection layer PPL. The display panel DP and the panel protection layer PPL may be bonded to each other by the fourth adhesive layer AL4.

The fifth adhesive layer AL5 may be disposed between the panel protection layer PPL and the cushion layer CUL. The panel protection layer PPL and the cushion layer CUL may be bonded to each other by the fifth adhesive layer AL5.

The sixth adhesive layer AL6 may be disposed between the cushion layer CUL and the support plate SPT. The cushion layer CUL and the support plate SPT may be bonded to each other by the sixth adhesive layer AL6.

In an embodiment, the first to sixth adhesive layers AL1 to AL6 may include a pressure sensitive adhesive ("PSA"), or a transparent adhesive such as an optically clear adhesive ("OCA").

Figure 6:
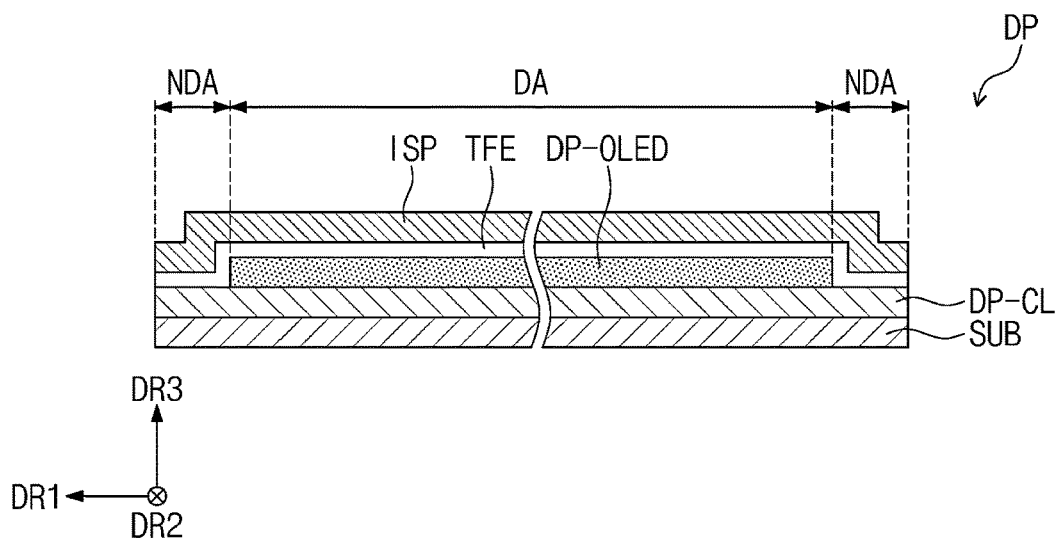
FIG. 6 illustrates, as an example, a cross section of the display panel illustrated in FIG. 5.

FIG. 6 illustrates, as an example, a cross section of the display panel illustrated in FIG. 5.

Referring to FIG. 6, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. The substrate SUB may include a flexible plastic material. In an embodiment, the substrate may include PI, for example.

The display element layer DP-OLED may be disposed on the display region DA. The thin-film encapsulation layer TFE may be disposed on the circuit element layer DP-CL so as to cover the display element layer DP-OLED. A plurality of pixels may be disposed in the circuit element layer DP-CL and the display element layer DP-OLED. In an embodiment, each of the pixels may include a transistor disposed in the circuit element layer DP-CL and a light-emitting element disposed in the display element layer DP-OLED and connected to the transistor, for example.

When the display panel DP is manufactured, the input sensing unit ISP may be manufactured directly on the thin-film encapsulation layer TFE. However, without being limited thereto, the input sensing unit ISP may be manufactured as a panel independent of the display panel DP and then attached to the thin-film encapsulation layer TFE by an adhesive layer.

Figure 7:
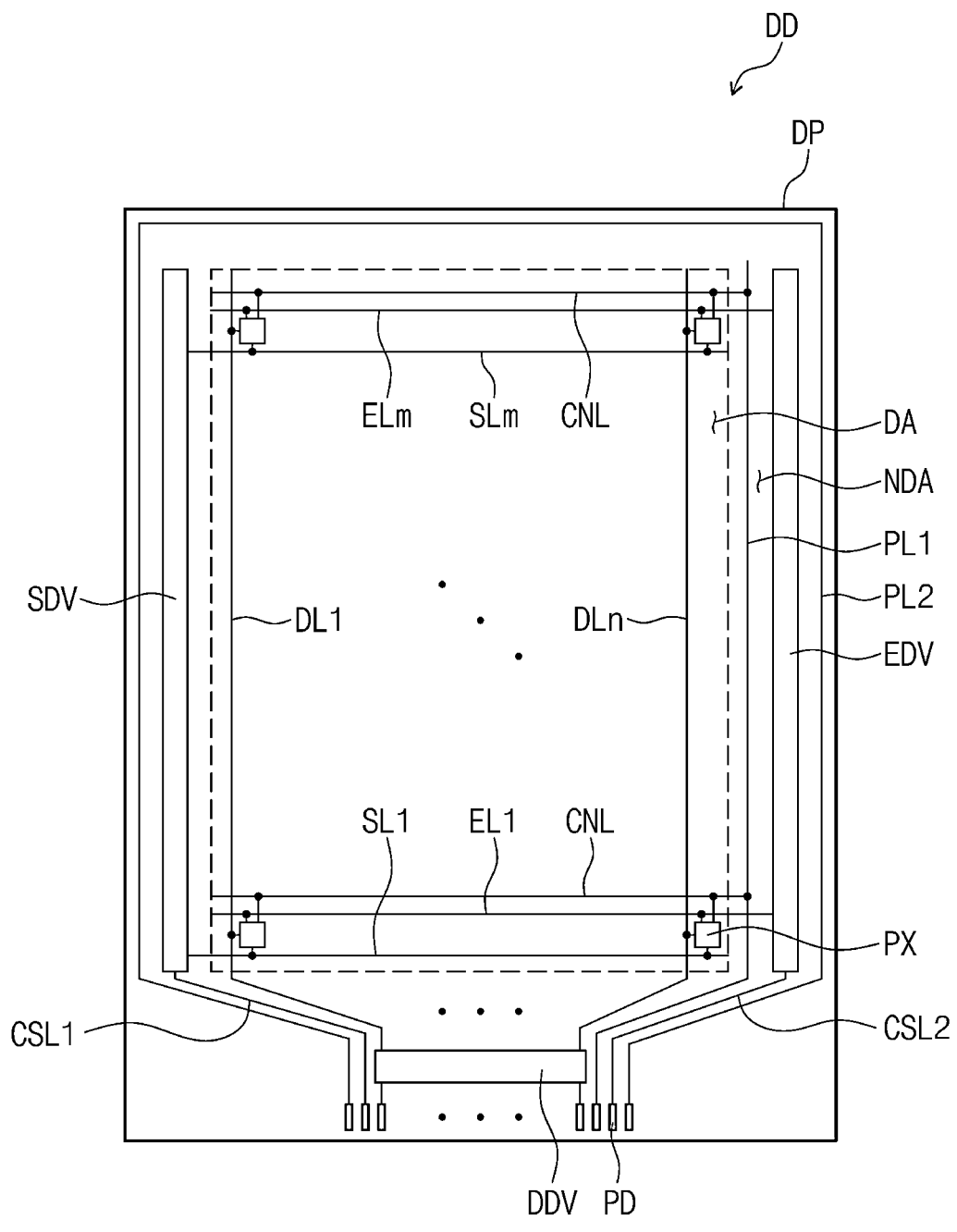
FIG. 7 is a plane view of the display panel illustrated in FIG. 5.

FIG. 7 is a plane view of the display panel illustrated in FIG. 5.

Referring to FIG. 7, the display device DD may include a display panel DP, a scan driver SDV, a data driver DDV, alight emission driver EDV, and a plurality of pads PD.

The display panel DP may have a quadrangular (e.g., rectangular) shape having long sides extending in the first direction DR1 and short sides extending in the second direction DR2, but the shape of the display panel DP is not limited thereto. The display panel DP may include a display region DA and a non-display region NDA surrounding the display region DA.

The display panel DP may include a plurality of pixels PX, a plurality of scan lines SL1 to plurality of data lines DL1 to DLn, a plurality of light emission lines EL1 to ELm, first and second control lines CSL1 and CSL2, first and second power lines PL1 and PL2, and connection lines CNL. Here, "m" and "n" are natural numbers.

The pixels PX may be disposed in the display region DA. The scan driver SDV and the light emission driver EDV respectively adjacent to the long sides of the display panel DP may be disposed in the non-display region NDA. The data driver DDV adjacent to one of the short sides of the display panel DP may be disposed in the non-display region NDA. In a plan view, the data driver DDV may be adjacent to the lower end of the display panel DP.

The scan lines SL1 to SLm may extend in the second direction DR2 to be connected to the scan driver SDV. The data lines DL1 to DLn may extend in the first direction DR1 to be connected to the pixels PX and the data driver DDV. The light emission lines EL1 to ELm may extend in the second direction DR2 to be connected to the pixels PX and the light emission driver EDV.

The first power line PL1 may extend in the first direction DR1 to be disposed in the non-display region NDA. The first power line PL1 may be disposed between the display region DA and the light emission driver EDV. However, without being limited thereto, the first power line PL1 may be disposed between the display region DA and the scan driver SDV.

The connection lines CNL may extend in the second direction DR2 and be arranged in the first direction DR1. The connection lines CNL may be connected to the first power line PL1 and the pixels PX. A first voltage may be applied to the pixels PX through the first power line PL1 and the connection lines CNL connected to each other.

The second power line PL2 may be disposed in the non-display region NDA. The second power line PL2 may extend along the long sides of the display panel DP and the other short side of the short sides of the display panel DP, near which the data driver DDV is not disposed. The second power line PL2 may be disposed outside the scan driver SDV and the light emission driver EDV.

Although not illustrated, the second power line PL2 may extend toward the display region DA so as to be connected to the pixels PX. A second voltage having a lower level than the first voltage may be applied to the pixels PX through the second power line PL2.

The first control line CSL1 may be connected to the scan driver SDV and, in a plan view, extend toward the lower end of the display panel DP. The second control line CSL2 may be connected to the light emission driver EDV and, in a plan view, extend toward the lower end of the display panel DP. The data driver DDV may be disposed between the first control line CSL1 and the second control line CSL2.

The pads PD may be disposed on the display panel DP. The pads PD may be closer to the lower end of the display panel DP than the data driver DDV is to the lower end of display panel DP. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DL2.

Although not illustrated, the display device DD may further include a timing controller for controlling the operation of the scan driver SDV, the data driver DDV, and the light emission driver EDV, and a voltage generator for generating first and second voltages. The timing controller and the voltage generator may be connected to corresponding pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of light emission signals and the light emission signals may be applied to the pixels PX through the light emission lines EL1 to ELm.

The pixels PX may receive data voltages in response to scan signals. The pixels PX may display an image by emitting light having luminance corresponding to the data voltages in response to the light emission signals. A light emission time of the pixels PX may be controlled by the light emission signals.

Figure 8:
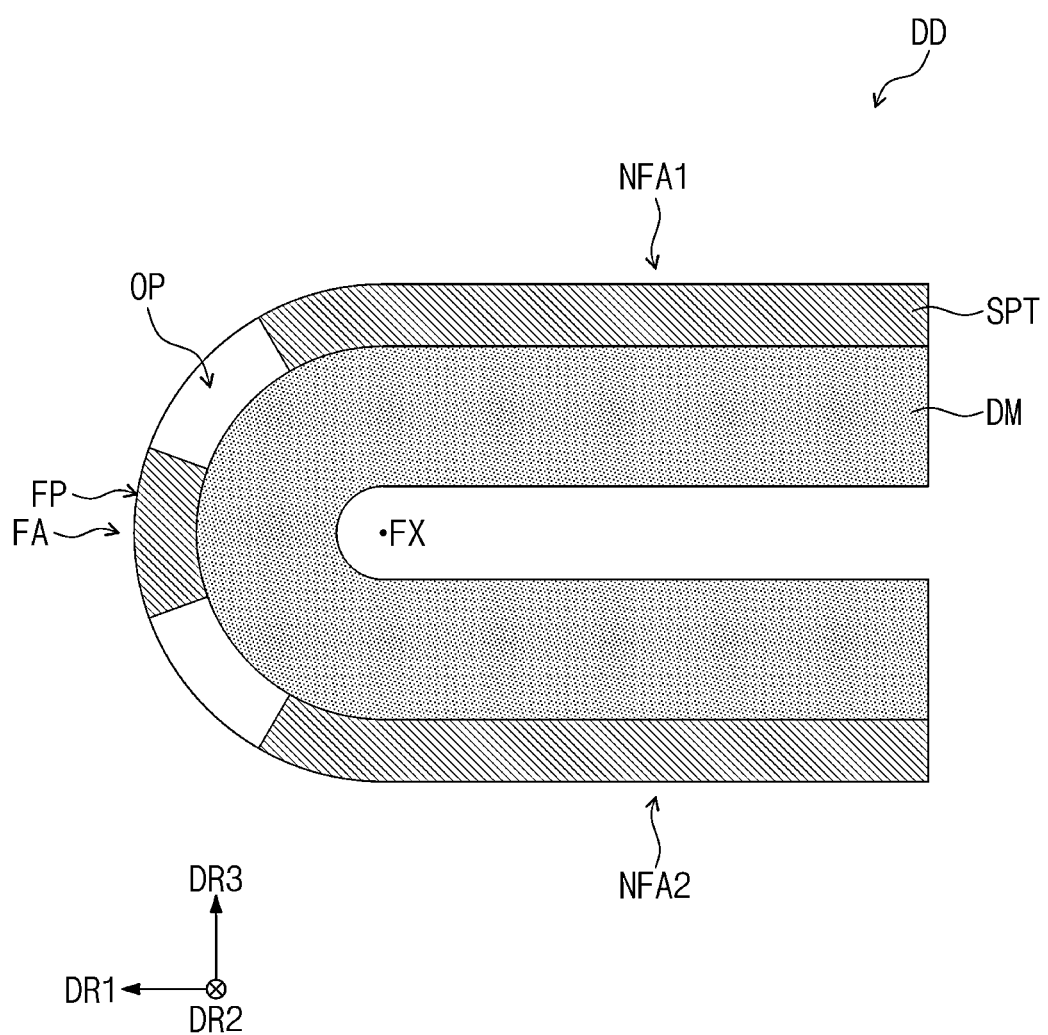
FIG. 8 illustrates a folded state of the display device illustrated in FIG. 5.

FIG. 8 illustrates a folded state of the display device illustrated in FIG. 5.

In an embodiment, a display module DM is illustrated as a single layer in FIG. 8.

Referring to FIG. 8, the display device DD may be folded around the folding axis FX. The folding region FA is bent around the folding axis FX so that the display device DD may be folded. The folding portion FP is bent around the folding axis FX so that the support plate SPT may be folded. Since openings OP are defined in the folding portion FP, the support plate SPT may be easily folded. As a result, the display device DD may be more easily folded.

Figure 9:
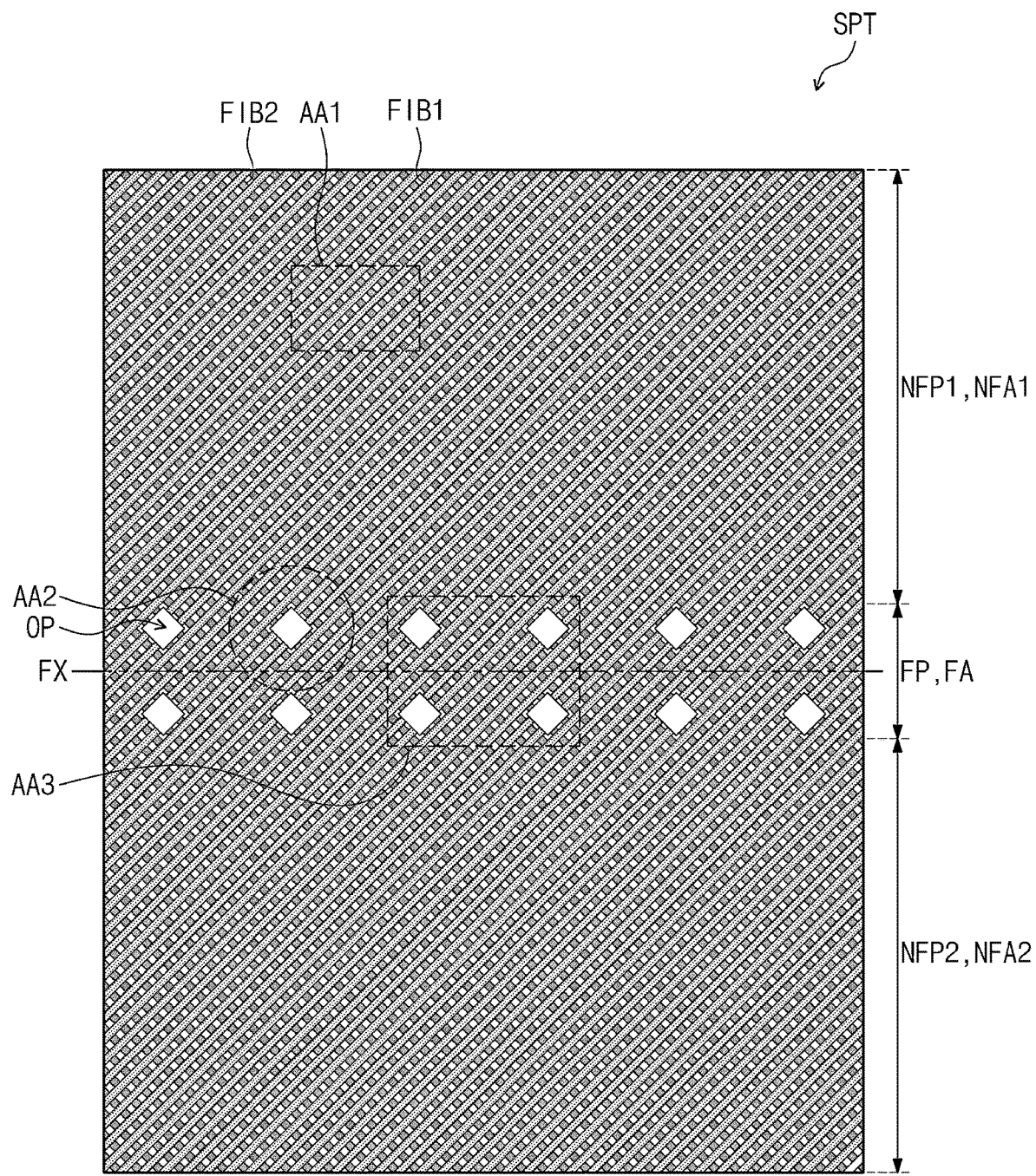
FIG. 9 is a plane view of the support plate illustrated in FIG. 5.
Figure 9:
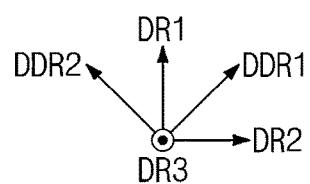

FIG. 9 is a plane view of the support plate illustrated in FIG. 5.

Referring to FIG. 9, the support plate SPT may have a quadrangular (e.g., rectangular) shape having long sides extending in the first direction DR1 and short sides extending in the second direction DR2, but the shape of the support plate SPT is not limited thereto.

The support plate SPT may include a first non-folding portion NFP1, a second non-folding portion NFP2, and a folding portion FP disposed between the first and second non-folding portions NFP1 and NFP2. The first non-folding portion NFP1 may overlap the first non-folding region NFA1, the folding portion FP may overlap the folding region FA, and the second non-folding portion NFP2 may overlap the second non-folding region NFA2.

The support plate SPT may include a plurality of first fibers FIB1 and a plurality of second fibers FIB2. The first fibers FIB1 and the second fibers FIB2 may include carbon fibers.

In a plan view, the first fibers FIB1 and the second fibers FIB2 may extend to cross each other. In an embodiment, the first fibers FIB1 may extend in a first diagonal direction DDR1, and the second fibers FIB2 may extend in a second diagonal direction DDR2, for example. The first diagonal direction DDR1 may be defined as a direction extending at an angle greater than or equal to 0 degree and less than 90 degrees with respect to the second direction DR2 in a plan view defined by the first and second directions DR1 and DR2.

The second diagonal direction DDR2 may be defined as a direction crossing the first diagonal direction DDR1 in a plan view defined by the first and second directions DR1 and DR2. The second diagonal direction DDR2 may be defined as a direction extending at an angle greater than or equal to 90 degrees and less than 180 degrees with respect to the second direction DR2.

The openings OP defined in the folding portion FP nay have a rhombic shape having sides extending in the first and second diagonal directions DDR1 and DDR2. The openings OP may be arranged in the first diagonal direction DDR1 and the second diagonal direction DDR2 based on a position in which rhombus-shaped sides are disposed. In addition, the openings OP may be arranged in the first and second directions DR1 and DR2 based on a position in which rhombus-shaped vertices are disposed.

Figure 10:
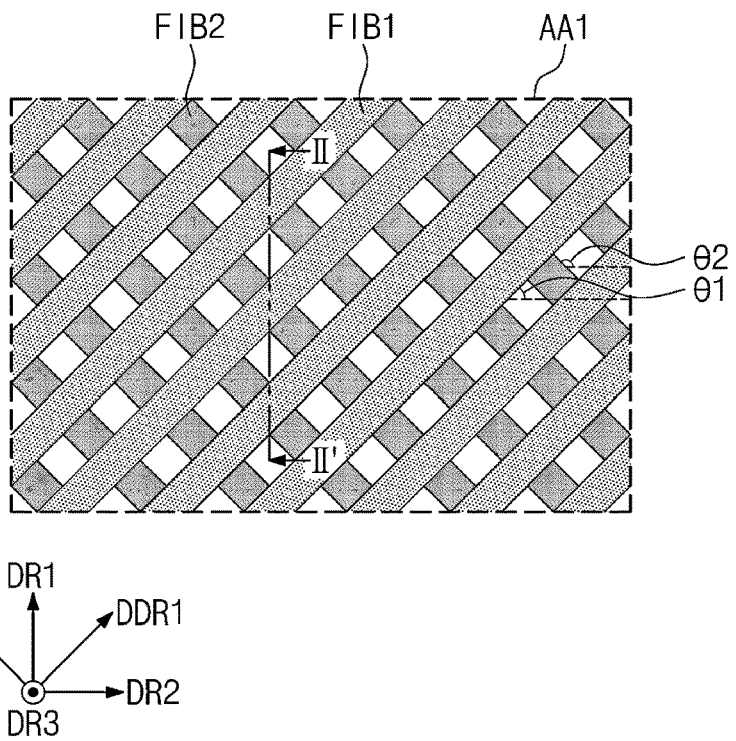
FIG. 10 is an enlarged view of the first region AA1 illustrated in FIG. 9.
Figure 11:
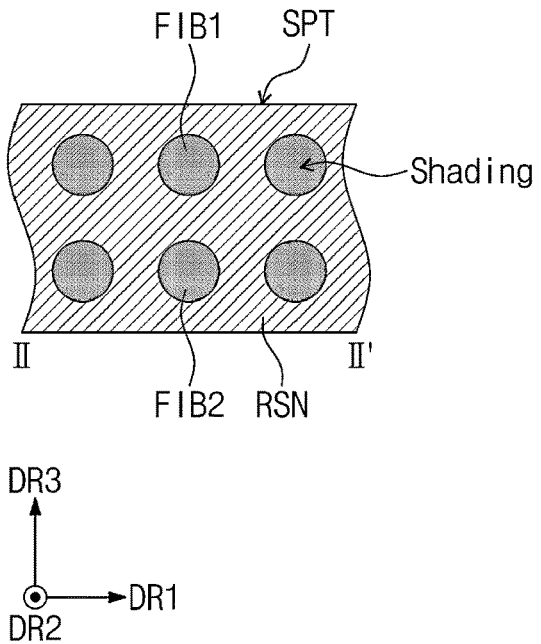
FIG. 11 is a cross-sectional view taken along line II-II' illustrated in FIG. 10.

FIG. 10 is an enlarged view of the first region AA1 illustrated in FIG. 9. FIG. 11 is a cross-sectional view taken along line II-II' illustrated in FIG. 10.

Referring to FIGS. 10 and 11, the support plate SPT may include a resin layer RSN and the first and second fibers FIB1 and FIB2 disposed inside the resin layer RSN. The resin layer RSN may include a plastic material. The first fibers FIB1 and the second fibers FIB2 may be disposed in different locations from each other in the third direction (also referred to as a thickness direction) DR3. In an embodiment, the second fibers FIB2 may be disposed below the first fibers FIB1, for example. However, without being limited thereto, the second fibers FIB2 may be disposed above the first fibers FIB1.

The first fibers FIB1 may extend in the first diagonal direction DDR1 and be arranged in the second diagonal direction DDR2. That is, the first fibers FIB1 may extend at a first angle $\theta 1$ greater than or equal to 0 degree and less than 90 degrees with respect to the second direction DR2.

The second fibers FIB2 may extend in the second diagonal direction DDR2 and be arranged in the first diagonal direction DDR1. That is, the second fibers FIB2 may extend at a second angle $\theta 2$ greater than or equal to 90 degrees and less than 180 degrees with respect to the second direction DR2.

When the first fibers FIB1 extend at 0 degree with respect to the second direction DR2 and the second fibers FIB2 extend at 90 degrees with respect to the second direction DR2, the first fibers FIB1 and the second fibers FIB2 may cross each other perpendicularly. In this case, the first diagonal direction DDR1 may be parallel to the second direction DR2, and the second diagonal direction DDR2 may be parallel to the first direction DR1.

Although the first fibers FIB1 extend at 0 degree with respect to the second direction DR2, the second fibers FIB2 extend at an angle less than 180 degrees with respect to the second direction DR2 and, therefore, the first fibers FIB1 and the second fibers FIB2 may extend so as not to be parallel to each other.

Although the second fibers FIB2 extend at 90 degrees with respect to the second direction DR2, the first fibers FIB1 extend at an angle less than 90 degrees with respect to the second direction DR2 and, therefore, the second fibers FIB2 and the first fibers FIB1 may extend so as not to be parallel to each other.

The first fibers FIB1 may extend at an angle greater than 0 degree and less than 90 degrees with respect to the second direction DR2, and the second fibers FIB2 may extend at an angle greater than 90 degrees and less than 180 degrees with respect to the second direction DR2. In this case, the first diagonal direction DDR1 may cross the first and second directions DR1 and DR2. In addition, the second diagonal direction DDR2 may cross the first and second directions DR1 and DR2.

Figure 12:
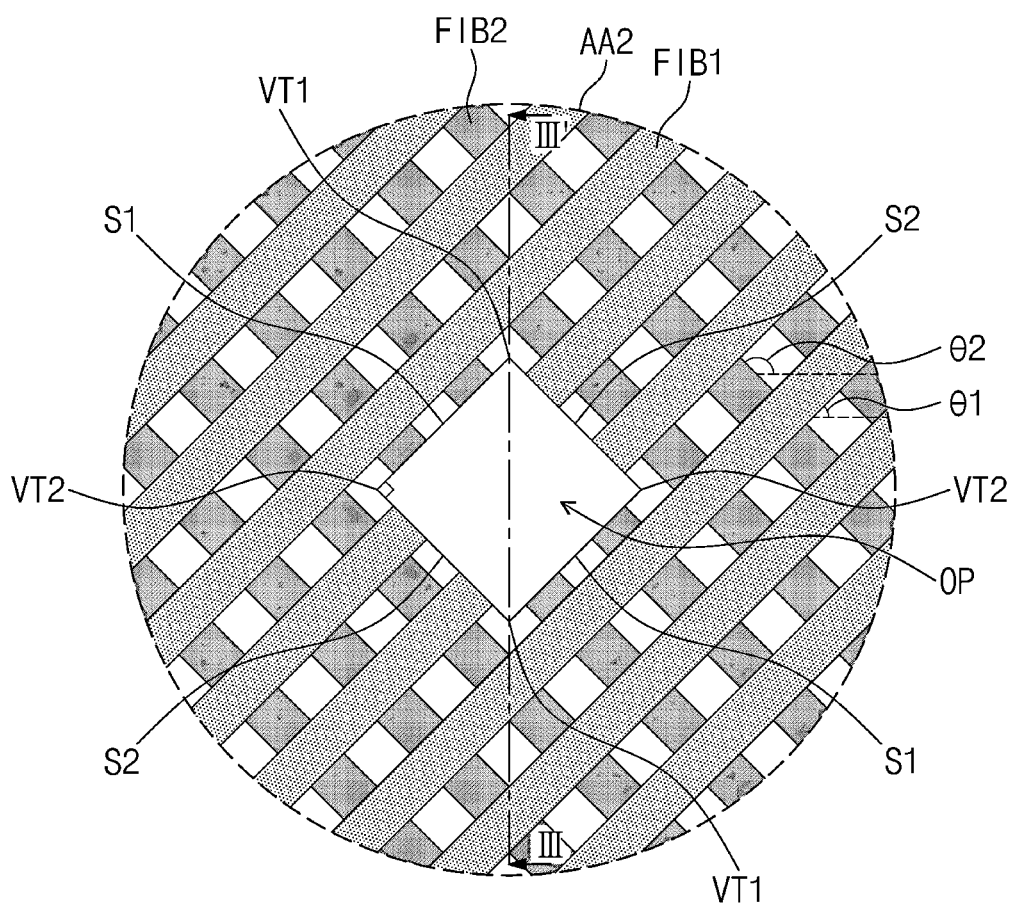
FIG. 12 is an enlarged view of the second region AA2 illustrated in FIG. 9.
Figure 13:
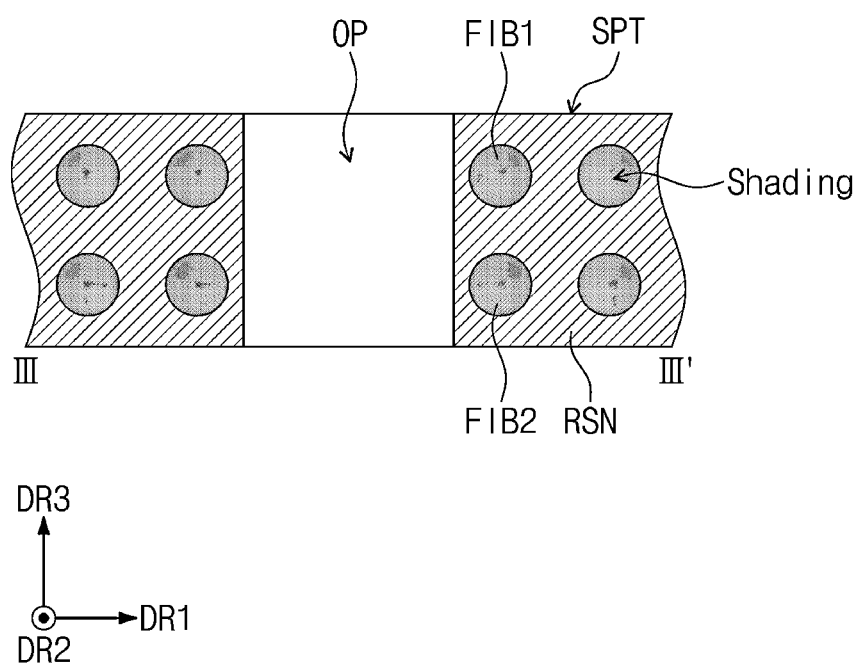
FIG. 13 is a cross-sectional view taken along line III-III' illustrated in FIG. 12.

FIG. 12 is an enlarged view of the second region AA2 illustrated in FIG. 9. FIG. 13 is a cross-sectional view taken along line III-III' illustrated in FIG. 12.

Referring to FIGS. 12 and 13, an opening OP may be defined by removing a predetermined portion of the support plate SPT. The opening OP may be defined by removing a portion of the resin layer RSN and portions of some of the first and second fibers FIB1 and FIB2.

The opening OP may include first sides S1 extending in parallel with the first fibers FIB1 and facing each other, and second sides S2 extending in parallel with the second fibers FIB2 and facing each other. Two first sides S1 may extend in the first diagonal direction DDR1 and face each other in the second diagonal direction DDR2. Two second sides S2 may extend in the second diagonal direction DDR2 and face each other in the first diagonal direction DDR1. The second sides S2 may be connected to ends of the first sides S1.

The opening OP may have a rhombic shape defined by the first d second sides S1 and S2 connected to each other. In an embodiment, the first fibers FIB1 and the second fibers FIB2 in FIG. 12 may cross each other perpendicularly. That is, the first diagonal direction DDR1 and the second diagonal direction DDR2 may cross each other perpendicularly.

An inner angle of the rhombic shape of the opening OP may be 90 degrees. In this case, the distance between first vertices VT1 opposite to each other n the first direction DR1 may be the same as the distance between second vertices VT2 opposite to each other in the second direction DR2.

Figure 14:
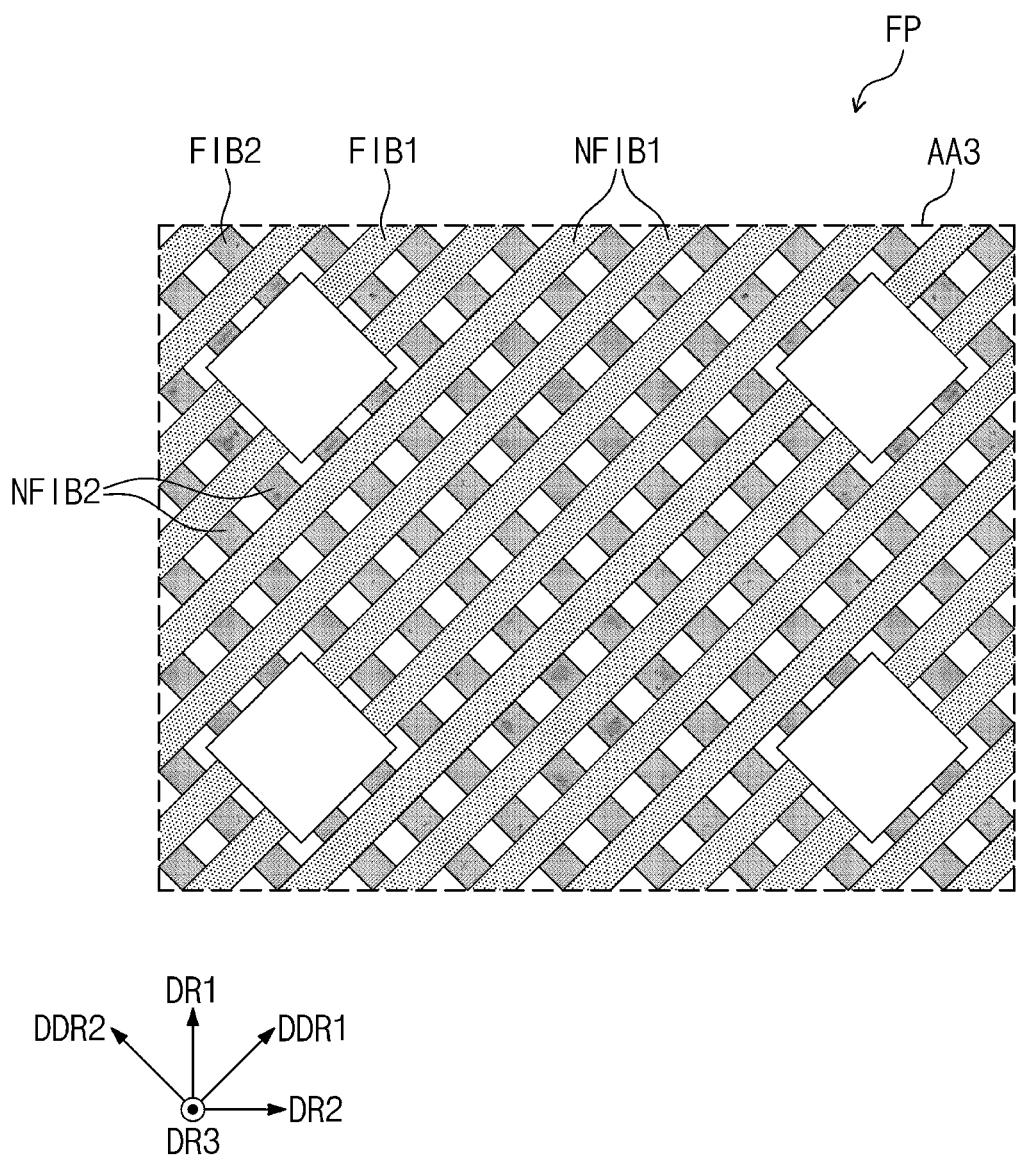
FIG. 14 is an enlarged view of the third region AA3 illustrated in FIG. 9.

FIG. 14 is an enlarged view of the third region AA3 illustrated in FIG. 9.

Referring to FIG. 14, in the folding portion FP, the openings OP may be defined in some of the first and second fibers FIB1 and FIB2 and may not be defined in the other first and second fibers FIB1 and FIB2. The openings OP may be partially defined in some of the first and second fibers FIB1 and FIB2.

In the first fibers FIB1 in which the openings OP are defined, the openings OP may be arranged along an extension direction of the first fibers FIB1. In the second fibers FIB2 in which the openings OP are defined, the openings OP may be arranged along an extension direction of the second fibers FIB2.

Although two openings OP arranged in the first diagonal direction DDR1 and two openings OP arranged in the second diagonal direction DDR2 are illustrated, the number of the openings OP is not limited thereto.

In the folding portion FP, some first fibers NFIB1 among the first fibers FIB1 may pass between the openings OP and extend in the first diagonal direction DDR1. In the folding portion FP, some second fibers NFIB2 among the second fibers FIB2 may pass between the openings OP and extend in the second diagonal direction DDR2.

The first fibers NFIB1 may be defined as the first fibers FIB1 in which the openings OP are not defined. The second fibers NFIB2 may be defined as the second fibers FIB2 in which the openings OP are not defined.

Specifically, in the folding portion FP the first fibers NFIB1 may pass between the openings OP arranged in the first direction DR1 and extend in the first diagonal direction DDR1. In addition, in the folding portion FP, the first fibers NFIB1 may pass between the openings OP arranged in the second direction DR2 and extend in the first diagonal direction DDR1.

Specifically, in the folding portion FP, the second fibers NFIB2 may pass between the openings OP arranged in the first direction DR1 and extend in the second diagonal direction DDR2. In addition, in the folding portion FP, the second fibers NFIB2 may pass between the openings OP arranged in the second direction DR2 and extend in the second diagonal direction DDR2.

According to the above structures, the first and second fibers FIB1 and FIB2 in which the openings OP are defined and the first and second fibers NFIB1 and NFIB2 in which the openings OP are not defined may be disposed in the folding portion FP.

Figure 15:
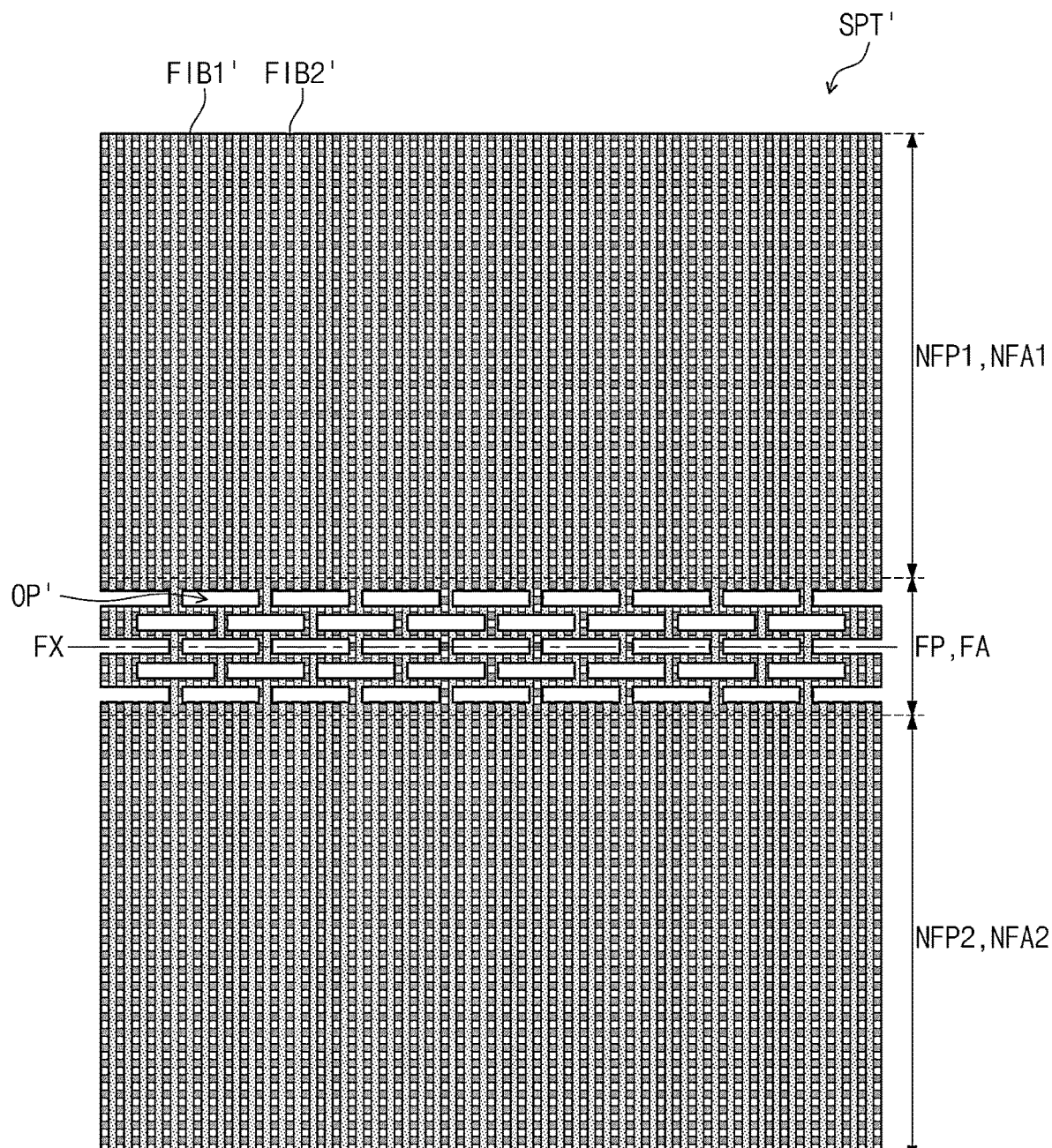
FIG. 15 illustrates a plane configuration of a support plate according to a comparative embodiment.

FIG. 15 illustrates a plane configuration of a support plate according to a comparative embodiment.

Referring to FIG. 15, the support plate SPT' may include a plurality of first fibers FIB1' extending in the first direction DR1 and a plurality of second fibers FIB2' extending in the second direction DR2. The first fibers FIB1' and the second fibers FIB2' may be disposed in different layers.

A plurality of openings OP' may be defined in the folding portion FP of the support plate SPT' overlapping the folding region FA. The openings OP' may extend in the second direction DR2. The openings OP' may be arranged in the first direction DR1 and the second direction DR2.

The first direction DR1 may correspond to a column direction, and the second direction DR2 may correspond to a row direction. The openings OP' arranged in the h-th row may be alternately arranged with the openings OP' arranged in the h+1-th row. Here, h is a natural number. The openings OP' arranged in the h-th row and the openings OP' arranged in the h+1-th row may partially overlap each other when viewed from the first direction DR1.

Depending on the structures of the openings OP', all of the first fibers FIB1' may be cut in the folding portion FP of the support plate SPT. Accordingly, when the folding portion FP is stretched, the restoring force of the folding portion FP to be restored may be reduced. In addition, as all of the first fibers FIB1' are cut in the folding portion FP, the lifespan of the support plate SPT' may be reduced.

Although a state in which all of the first fibers FIB1' are cut in the folding portion FP is illustrated, when the first fibers FIB1' extend in the second direction DR2 and the second fibers FIB2' extend in the first direction DR1, all of the second fibers FIB2' may be cut in the folding part FP by the openings OP.

Once again, referring to FIGS. 9 and 14, in an embodiment of the invention, depending on an arrangement structure of the openings OP, in the folding portion FP, the openings OP may be defined in some of the first and second fibers FIB1 and FIB2, and the openings OP may not be defined in some of the first and second fibers NFIB1 and NFIB2. Accordingly, cutting of the first and second fibers FIB1 and FIB2 in the folding portion FP may be minimized. As a result, the restoring force of the folding portion FP may not be reduced, and the lifespan of the support plate SPT may not be reduced.

Figure 16:
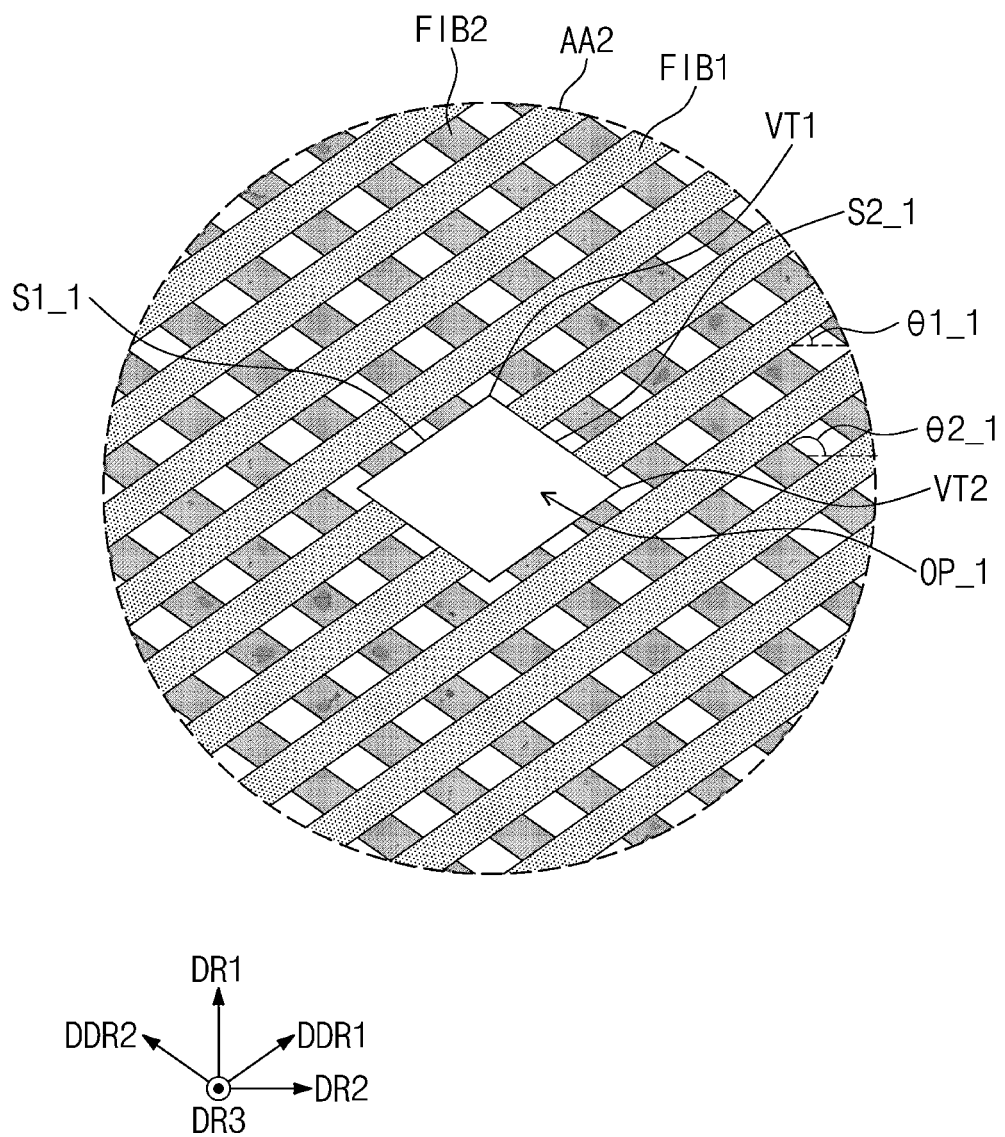
FIGS. 16 to 18 illustrate configurations of openings according to various extension directions of the first and second fibers illustrated in FIG. 9.
Figure 17:
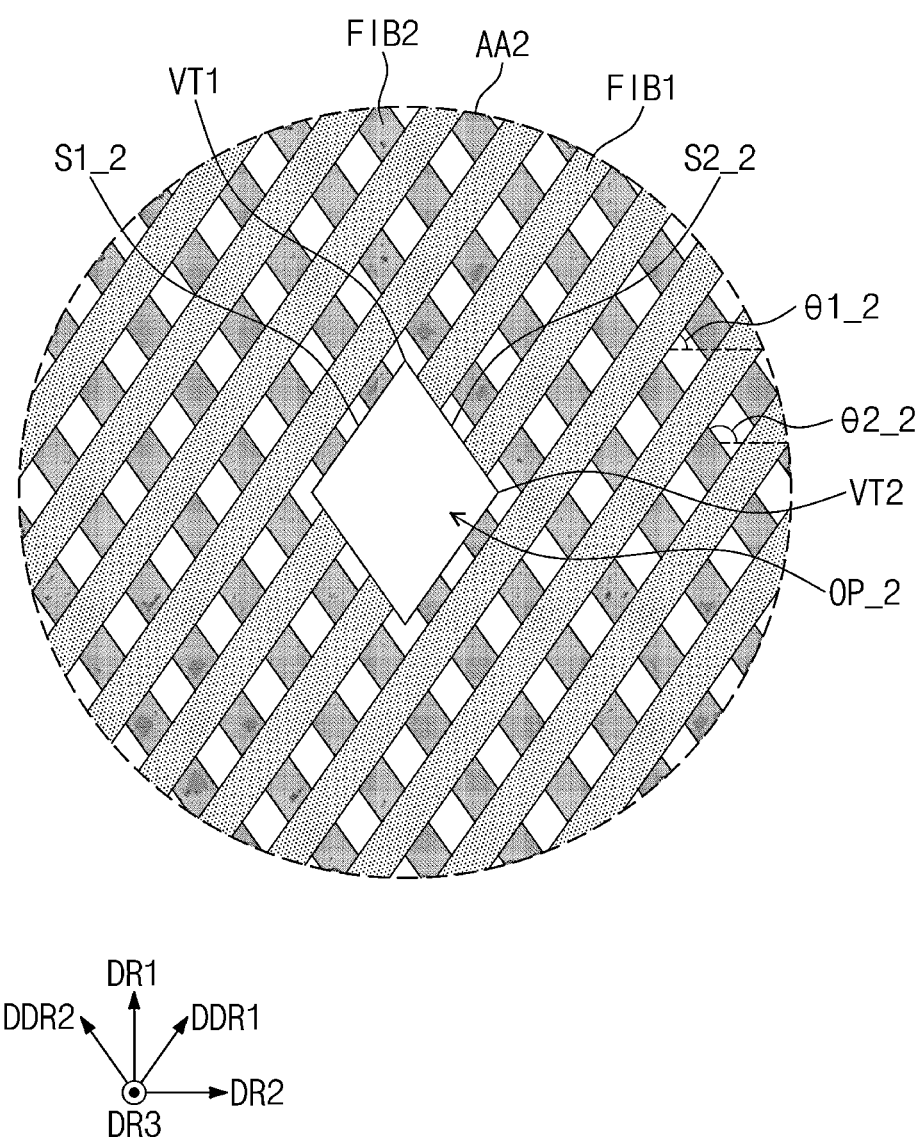
Figure 18:
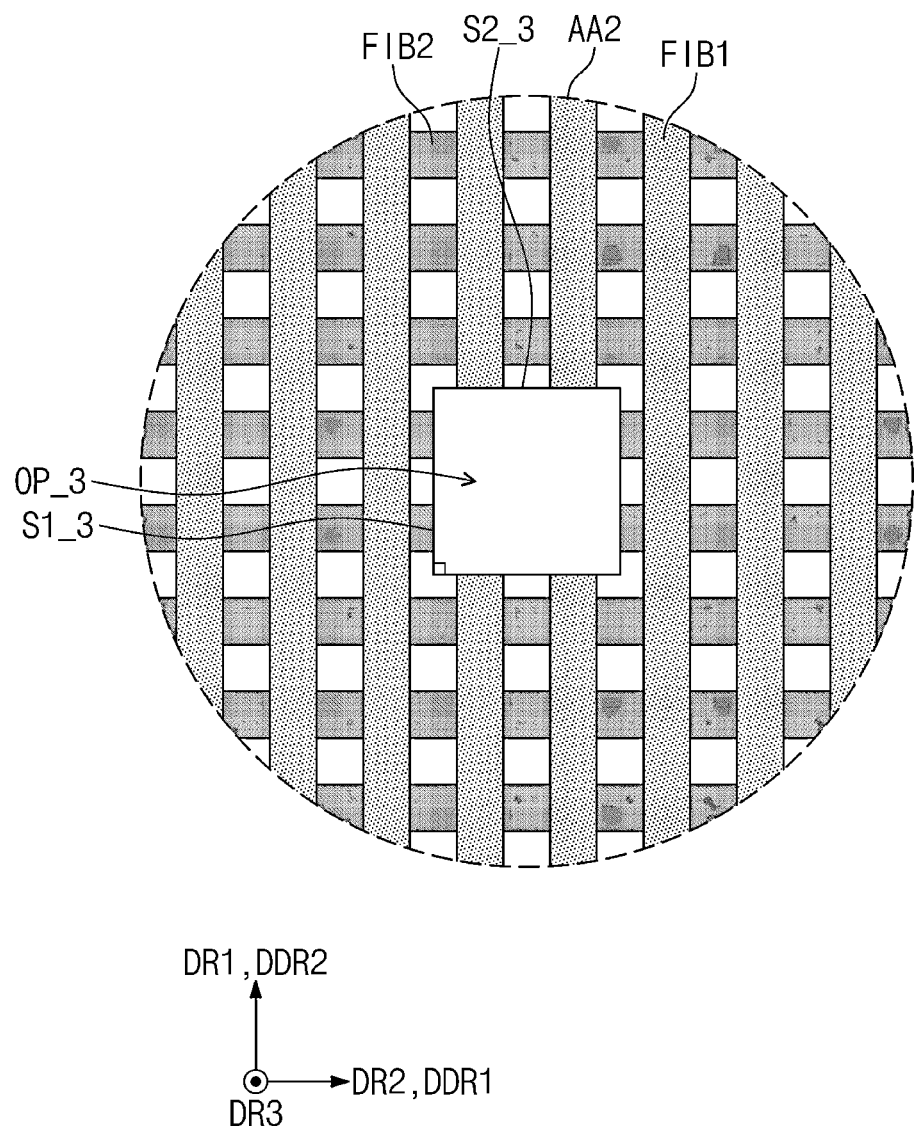

FIGS. 16 to 18 illustrate configurations of openings according to various extension directions of the first and second fibers illustrated in FIG. 9.

In an embodiment, FIGS. 16 to 18 are illustrated as enlarged views corresponding to FIG. 12, and hereinafter, mostly, configurations different from the configuration shown in FIG. 12 will be described.

Referring to FIG. 16, an opening OP_1 defined in the folding region FA may have a rhombic shape extending longer in the second direction DR2 than in the first direction DR1. The distance between the first vertices VT1 opposite to each other in the first direction DR1 may be different from the distance between the second vertices VT2 opposite to each other in the second direction DR2. In an embodiment, the distance between the first vertices VT1 may be shorter than the distance be tween the second vertices VT2, for example.

In order to form the structure of the opening OP_1 as described above, the first diagonal direction DDR1 may extend at a first angle $\theta 1\_1$ greater than 0 degree and less than 45 degrees with respect to the second direction DR2. In addition, the second diagonal direction DDR2 may extend at a second angle $\theta 2\_1$ greater than 135 degrees and less than 180 degrees with respect to the second direction DR2.

The first fibers FIB1 may extend in the first diagonal direction DDR1 at the first angle $\theta 1\_1$ with respect to the second direction DR2 and be arranged in the second diagonal direction DDR2. The second fibers FIB2 may extend in the second diagonal direction DDR2 at the second angle $\theta 2\_1$ with respect to the second direction DR2 and be arranged in the first diagonal direction DDR1.

The opening OP_1 may include first sides S1_1 extending in the first diagonal direction DDR1 and facing each other in the second diagonal direction DDR2 and second sides S2_1 extending in the second diagonal direction DDR2 and facing each other in the first diagonal direction DDR1.

Referring to FIG. 17, an opening OP_2 defined in the folding region FA may have a rhombic shape extending longer in the second direction DR2 than in the first direction DR1. The distance between the first vertices VT1 opposite to each other in the first direction DR1 may be different from the distance between the second vertices VT2 opposite to each other in the second direction DR2. In an embodiment, the distance between the first vertices VT1 may be longer than the distance between the second vertices VT2, for example.

In order to form the structure of the opening OP_2 as described above, the first diagonal direction DDR1 may extend at a first angle $\theta 1\_2$ greater than 45 degrees and less than 90 degrees with respect to the second direction DR2. In addition, the second diagonal direction DDR2 may extend at a second angle $\theta 2\_2$ greater than 90 degrees and less than 135 degrees with respect to the second direction DR2.

The first fibers FIB1 may extend in the first diagonal direction DDR1 at the first angle $\theta 1\_2$ with respect to the second direction DR2 and be arranged in the second diagonal direction DDR2. The second fibers FIB2 may extend in the second diagonal direction DDR2 at the second angle $\theta 2\_2$ with respect to the second direction DR2 and be arranged in the first diagonal direction DDR1.

The opening OP_2 may include first sides S1_2 extending in the first diagonal direction DDR1 and facing each other in the second diagonal direction DDR2 and second sides S2_2 extending in the second diagonal direction DDR2 and facing each other in the first diagonal direction DDR1.

Referring to FIG. 18, an opening OP_3 defined in the folding region FA may have a tetragonal shape. In order to form the structure of the opening OP_3 as described above, the first diagonal direction DDR1 may extend in the second direction DR2, and the second diagonal direction DDR2 may extend in the first direction DR1.

The first fibers FIB1 may extend in the first direction DR1 and be arranged in the second direction DR2. The second fibers FIB2 may extend in the second direction DR2 and be arranged in the first direction DR1.

The opening OP_3 may include first sides S1_3 extending in the first direction DR1 and facing each other in the second direction DR2 and second sides S2_3 extending in the second direction DR2 and facing each other in the first direction DR1.

Figure 19:
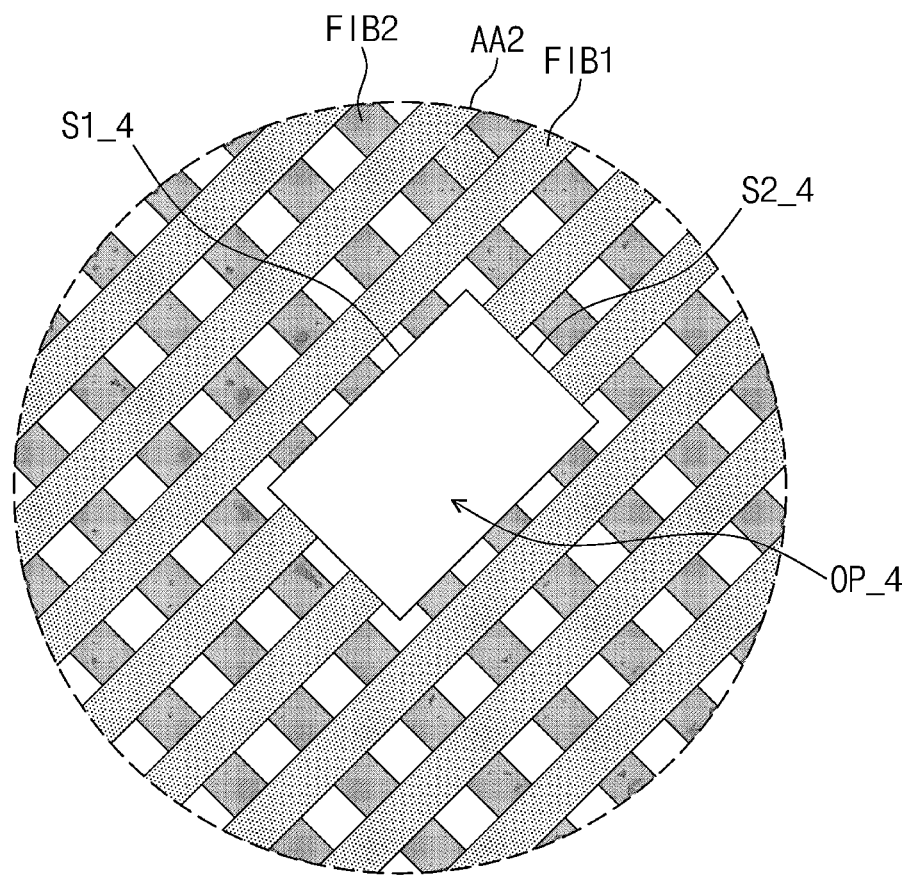
FIGS. 19 and 20 illustrate various shapes of the openings illustrated in FIG. 9.
Figure 19:
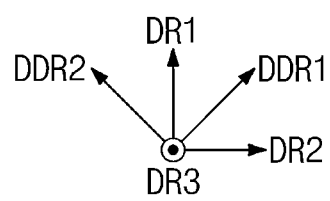
Figure 20:
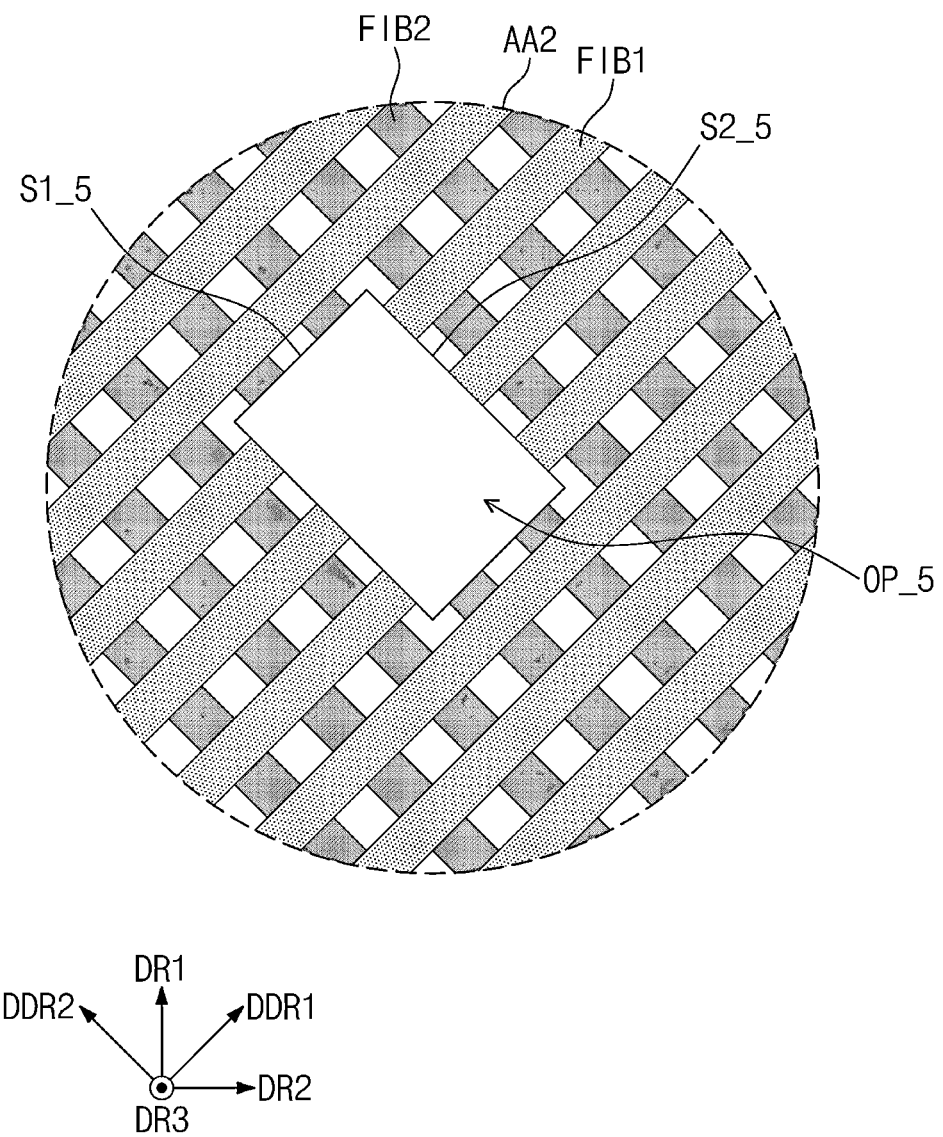

FIGS. 19 and 20 illustrate various shapes of the openings illustrated in FIG. 9.

In an embodiment, FIGS. 19 and 20 are illustrated as enlarged views corresponding to FIG. 12, and hereinafter, mostly, configurations different from the configuration shown in FIG. 12 will be described.

Referring to FIGS. 19 and 20, the extension directions of first and second fibers FIB1 and FIB2 may be the same as the extension directions of the first and second fibers FIB1 and FIB2 illustrated in FIG. 12. Openings OP_4 and OP_5 may extend longer n any one direction among an extension direction of the first fibers FIB1 and an extension direction of the second fibers FIB2.

Referring to FIG. 19, the opening OP_4 having a rhombic shape may extend longer in the first diagonal direction DDR1 than in the second diagonal direction DDR2. The opening OP_4 may include first sides S1_4 extending in the first diagonal direction DDR1 and facing each other in the second diagonal direction DDR2 and second sides S2_4 extending in the second diagonal direction DDR2 and facing each other in the first diagonal direction DDR1. The length of the first sides S1_4 may be greater than that of the second sides S2_4.

Referring to FIG. 20, the opening OP_5 having a rhombic shape may extend longer in the second diagonal direction DDR2 than in the first diagonal direction DDR1. The opening OP_5 may include first sides S1_5 extending in the first diagonal direction DDR1 and facing each other in the second diagonal direction DDR2 and second sides S2_5 extending in the second diagonal direction DDR2 and facing each other in the first diagonal direction DDR1. The length of the first sides S1_5 may be smaller than that of the second sides S2_5.

By the embodiments of the invention, the display device may be lightened by the support plate including CFRP to support the display module.

In addition, the display device may be easily folded as a plurality of openings are defined in a portion of the support plate overlapping the folding region.

Furthermore, in the folding portion of the support plate, openings are defined in some of the first and second fibers, and openings e not defined in the other first and second fibers. Therefore, cutting of the first and second fibers in the folding portion may be minimized.

Although the embodiments of the invention have been described, it is understood that the invention should not be limited to these embodiments but various changes and modifications may be made by one ordinary skilled in the art within the spirit and scope of the invention as hereinafter claimed.

What is claimed is:
1. A display device comprising:
  a display module; and
  a support plate disposed on the display module and comprising:
    a plurality of first fibers; and
    a plurality of second fibers disposed on the plurality of first fibers and crossing the plurality of first fibers in a plan view,
  wherein an opening is defined in the support plate and comprises:
    first sides parallel to the plurality of first fibers and facing each other; and second sides parallel to the plurality of second fibers and facing each other, and a size of the opening is greater than a size of a space defined by first fibers immediately next to each other among the plurality of first fibers and second fibers immediately next to each other among the plurality of second fibers.

2. The display device of claim 1, wherein the plurality of first and second fibers include carbon fibers.

3. The display device of claim 1, wherein the support plate further comprises a resin layer, and the plurality of first and second fibers are disposed inside the resin layer.

4. The display device of claim 1, wherein the display module comprises a first non-folding region, a second non-folding region, and a folding region disposed between the first and second non-folding regions, wherein:

the first and second non-folding regions and the folding region are arranged in a first direction; and the folding region is folded around a folding axis extending in a second direction crossing the first direction.

5. The display device of claim 4, wherein the opening overlaps the folding region in the plan view.

6. The display device of claim 4, wherein:

the plurality of first fibers extend in a first diagonal direction extending at an angle greater than or equal to 0 degree and less than 90 degrees with respect to the second direction and are arranged in a second diagonal direction extending at an angle greater than or equal to 90 degrees and less than 180 degrees with respect to the second direction; and the plurality of second fibers extend in the second diagonal direction and are arranged in the first diagonal direction.

7. The display device of claim 6, wherein:

the first sides extend in the first diagonal direction and face each other in the second diagonal direction; and the second sides extend in the second diagonal direction, face each other in the first diagonal direction, and are connected to ends of the first sides.

8. The display device of claim 6, wherein the opening is provided in plural, and a plurality of openings is arranged in the first diagonal direction and the second diagonal direction.

9. The display device of claim 8, wherein, in a folding portion of the support plate overlapping the folding region, some of the plurality of first fibers pass between openings of the plurality of openings arranged in the first direction and between openings of the plurality of openings arranged in the second direction and extend in the first diagonal direction.

10. The display device of claim 8, wherein, in a folding portion of the support plate overlapping the folding region, some of the plurality of second fibers pass between openings of the plurality of openings arranged in the first direction and between openings of the plurality of openings arranged in the second direction and extend in the second diagonal direction.

11. The display device of claim 4, wherein:

the opening is provided in plural; and in a folding portion of the support plate overlapping the folding region, a plurality of openings are defined in some of the plurality of first and second fibers and are not defined in remaining ones of the plurality first and second fibers.

12. The display device of claim 4, wherein the opening has a rhombic shape defined by the first sides and the second sides.

13. The display device of claim 12, wherein an inner angle of the rhombic shape is 90 degrees.

14. The display device of claim 12, wherein the distance between first vertices of the opening opposite to each other in the first direction is different from the distance between second vertices of the opening opposite to each other in the second direction.

15. The display device of claim 1, wherein the opening has a tetragonal shape.

16. The display device of claim 1, wherein the opening extends longer in any one direction among an extension direction of the plurality of first fibers and an extension direction of the plurality of second fibers.

17. A display device comprising:

a display module comprising a first non-folding region, a second non-folding region, and a folding region disposed between the first and second non-folding regions; and a support plate disposed on the display module and comprising:

a plurality of first fibers extending in a first diagonal direction and arranged in a second diagonal direction crossing the first diagonal direction; and a plurality of second fibers disposed at a location different from a location of the plurality of first fibers in a thickness direction, extending in the second diagonal direction, and arranged in the first diagonal direction, wherein an opening overlapping the folding region is defined in the support plate and comprises:

first sides extending in the first diagonal direction and facing each other in the second diagonal direction; and second sides extending in the second diagonal direction and facing each other in the first diagonal direction, and a size of the opening is greater than a size of a space defined by first fibers immediately next to each other among the plurality of first fibers and second fibers immediately next to each other among the plurality of second fibers.

18. The display device of claim 17, wherein:

the first non-folding region, the folding region, and the second non-folding region are arranged in a first direction;

the first diagonal direction extends at an angle greater than or equal to 0 degree and less than 90 degrees with respect to a second direction crossing the first direction; and the second diagonal direction extends at an angle greater than or equal to 90 degrees and less than 180 degrees with respect to the second direction.

19. The display device of claim 17, wherein:

the opening is provided in plural, in the folding portion of the support plate overlapping the folding region, some of the plurality of first fibers pass between a plurality of openings and extend in the first diagonal direction, and some of the plurality of second fibers pass between the plurality of openings and extend in the second diagonal direction.

20. A display device comprising:

a display module extending in a first direction and foldable around a folding axis parallel to a second direction crossing the first direction; and a support plate disposed on the display module and comprising:

a plurality of first fibers extending in a first diagonal direction crossing the first and second directions; and a plurality of second fibers disposed at a location different from a location of the plurality of first fibers in a thickness direction, and extending in a second diagonal direction crossing the first diagonal direction, wherein openings overlapping the folding region are defined in the support plate and arranged in the first diagonal direction and the second diagonal direction, and a size of the opening is greater than a size of a space defined by first fibers immediately next to each other among the plurality of first fibers and second fibers immediately next to each other among the plurality of second fibers.

* * * * *